United States Patent
Kim et al.

(10) Patent No.: US 10,431,565 B1
(45) Date of Patent: Oct. 1, 2019

(54) WAFER EDGE PARTIAL DIE ENGINEERED FOR STACKED DIE YIELD

(71) Applicant: Xilinx, Inc., San Jose, CA (US)

(72) Inventors: Myongseob Kim, Pleasanton, CA (US); Henley Liu, San Jose, CA (US); Cheang-Whang Chang, Mountain View, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/907,034

(22) Filed: Feb. 27, 2018

(51) Int. Cl.
H01L 25/065 (2006.01)
H01L 23/522 (2006.01)
H01L 25/00 (2006.01)
H01L 23/00 (2006.01)

(52) U.S. Cl.
CPC ...... *H01L 25/0657* (2013.01); *H01L 23/5227* (2013.01); *H01L 24/03* (2013.01); *H01L 25/50* (2013.01)

(58) Field of Classification Search
CPC . H01L 25/0657; H01L 23/5227; H01L 24/03; H01L 25/50; H01L 21/78; H01L 21/187; H01L 33/0079; H01L 2223/5446; H01L 2225/06593; H01L 24/09; H01L 25/043; H01L 25/074; H01L 25/0756; H01L 25/117; H01L 2224/81894–81896
See application file for complete search history.

(56) References Cited

U.S. PATENT DOCUMENTS

| | | | |
|---|---|---|---|
| 7,709,876 B2 | 5/2010 | Ayotte et al. | |
| 8,710,658 B2 | 4/2014 | Aboush | |
| 9,666,566 B1* | 5/2017 | Chen | H01L 25/105 |
| 2010/0059897 A1* | 3/2010 | Fay | H01L 24/03 257/777 |
| 2014/0346622 A1* | 11/2014 | Stuber | H01L 25/00 257/416 |
| 2015/0054176 A1* | 2/2015 | Sim | H01L 27/11531 257/775 |
| 2015/0079734 A1* | 3/2015 | Zuo | H01L 23/544 438/113 |
| 2015/0108644 A1* | 4/2015 | Kuang | H01L 24/06 257/751 |
| 2015/0279816 A1* | 10/2015 | Chen | H01L 25/0657 257/774 |
| 2017/0084595 A1* | 3/2017 | Seddon | H01L 23/49827 |

* cited by examiner

*Primary Examiner* — Shahed Ahmed
(74) *Attorney, Agent, or Firm* — Patterson + Sheridan, LLP (57) ABSTRACT

A stacked wafer assembly and method for fabricating the same are described herein. In one example, a stacked wafer assembly includes a first wafer bonded to a second wafer. The first wafer includes a plurality of fully functional dies and a first partial die formed thereon. The second wafer includes a plurality of fully functional dies and a first partial die formed thereon. Bond pads formed over an inductor of the first partial die of the first wafer are bonded to bond pads formed on the first partial die of the second wafer to establish electrical connection therebetween.

11 Claims, 9 Drawing Sheets

WAFER EDGE PARTIAL DIE ENGINEERED FOR STACKED DIE YIELD

BACKGROUND

Examples of the present disclosure generally relate to stacked wafer assembly, and more particularly, to a stacked wafer assembly having a bond pads of a partial die formed on a first wafer of the stacked wafer assembly bonded to bond pads formed on a partial die of formed on a second wafer of the stacked wafer assembly.

RELATED ART

Electronic devices, such as tablets, computers, server, in-door telecom, out-door telecom, industrial computers, high performance computing data centers, copiers, digital cameras, smart phones, control systems and automated teller machines, among others, often employ electronic components which leverage stacked chip packages for increased functionality and higher component density. Conventional chip packages often include stacked components such as integrated circuit (IC) dies, through-silicon-via (TSV) interposer, and a package substrate, with the chip package itself stacked on a printed circuit board (PCB). The IC dies may include CMOS image sensors, microelectromechanical system (MEMS), logic and logic integration, logic and memory integration memory, logic, RF or other IC device.

Wafer bonding is utilized to fabricate stacked chip packages. Wafer bonding is a wafer-level process used to bond the face of one wafer to the face of another wafer to form a stacked wafer assembly (also known as a wafer on wafer (WoW) assembly. Wafer bonding can utilize dielectric to dielectric bonding, such as oxide bonding, or hybrid bonding that utilizes metals bonding to metals and dielectric bonding to dielectric. Successful wafer bonding requires the topology of the wafers to be very flat prior to bonding, which is very challenging particularly for wafers having many metal layers. Generally, patterns across the entire wafer should be as uniform as possible in order to achieve a flat wafer topology.

Only dies that can be fabricated fully within the bounds of the wafer can have complete functionality. Meanwhile, the dies that cannot be fully fabricated within the bounds of the wafer are not fully functional (i.e., formed in the exclusion zone at the wafer's edge), and consequently often referred to a partial dies. The partial dies at the wafer edge are generally fabricated using the same mask set utilized to form the fully functional dies, but differences in pattern density and metal layer thicknesses make it extremely challenging to keep the entire wafer topology flat.

However, even with printing all the metal layers in the partial dies to improve the pattern uniformity at wafer edge, there is still pattern density variation within each die. Compounding this within-die pattern density variation with the wafer edge effect, the wafer edge dies can be prone to defects that can cause either die yield loss or wafer yield loss. In particular, bubbles in the wafer edge after wafer bonding often is a precursor to silicon peeling, which necessitates that the wafer be scrapped. Although most of the dies with bubbles are partial dies that won't be functional, the entire bonded stacked wafer assembly if often rejected due to the presences of bubbles due to the high risk of peeling. Accordingly, bubbles are responsible for this serious yield loss.

Thus, there is a need for improved stacked wafer assembly and methods for forming the same.

SUMMARY

Examples of the present disclosure relate to stacked wafer assembly and methods for forming the same. In one example, a stacked wafer assembly includes a first wafer bonded to a second wafer. The first wafer includes a plurality of fully functional dies and a first partial die formed thereon. The second wafer includes a plurality of fully functional dies and a first partial die formed thereon. Bond pads formed under an inductor of the first partial die of the first wafer are bonded to bond pads formed on the first partial die of the second wafer to establish electrical connection therebetween.

In another example, a method for forming a stacked wafer assembly is provided that includes contacting an exposed dielectric material layer of a first wafer to an exposed dielectric material layer of a second wafer, pressing the first wafer against the second wafer to cause the dielectric material layers to create a bond between the first wafer and the second wafer, forming electrical connections between bond pads formed over a first inductor of a partial die residing on the first wafer and bond pads formed on a partial die residing on the second wafer, and forming electrical connections between bond pads of a full die residing on the first wafer and bond pads formed on a full die residing on the second wafer.

In yet another example, a stacked wafer assembly includes a first wafer, a second wafer and an adhesion layer bonding the second wafer to the first wafer. The first wafer has a plurality of fully functional dies and a first partial die formed thereon. The second wafer has a plurality of fully functional dies and a first partial die formed thereon. Bond pads formed under a first inductor of the first partial die of the first wafer are bonded to bond pads formed under a second inductor of the first partial die of the second wafer.

BRIEF DESCRIPTION OF THE DRAWINGS

So that the manner in which the above recited features of the present invention can be understood in detail, a more particular description of the invention, briefly summarized above, may be had by reference to examples, some of which are illustrated in the appended drawings. It is to be noted, however, that the appended drawings illustrate only typical examples of this invention and are therefore not to be considered limiting of its scope, for the invention may admit to other equally effective examples.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe techniques for wafer to wafer stacking for the ultimate fabrication of package assemblies having stacked integrated circuit chips. In particular, the techniques disclosed herein significantly reduce bubble formation between wafers during bonding of the stacked wafers, thus substantially reducing the probability of delamination, and consequently, advantageously increasing product yield of the integrated circuit devices having stacked dies separated from the stacked wafers. The techniques described herein utilize one or more conductive bond pads formed over inductors for connecting partial dies formed within in the exclusion zones of opposing stacked wafers. The bond pads formed over inductors of partial dies connected between wafers in the exclusion zone is believed to provide improved flatness and more consistent topography, which has been observed to reduce the potential for bubble formation between the wafers of the stacked wafer assembly, which substantially reduces the incidence of peeling and delamination while increasing product yield.

In one example, improvements to the stacked wafer assembly are realized by using a different mask set for the fabrication of partial dies located at the wafer edge. The mask set utilized to form the partial dies has very uniform patterns or some specific patterns selected to include bond pads over inductors to improve the wafer to wafer bonding process. This mask set can be either a full layer mask set or just a partial layer mask set which include the top metal layers that have more impact on final wafer topology and wafer bonding. Advantageously, this technique does not impact the gross number of fully functional dies per wafer (i.e., the number of complete dies fully formed within the wafer). Therefore, improved wafer bonding yield and process window is enhanced without compromising the gross number of dies per wafer that can be realized from a stacked wafer assembly.

Figure 1:
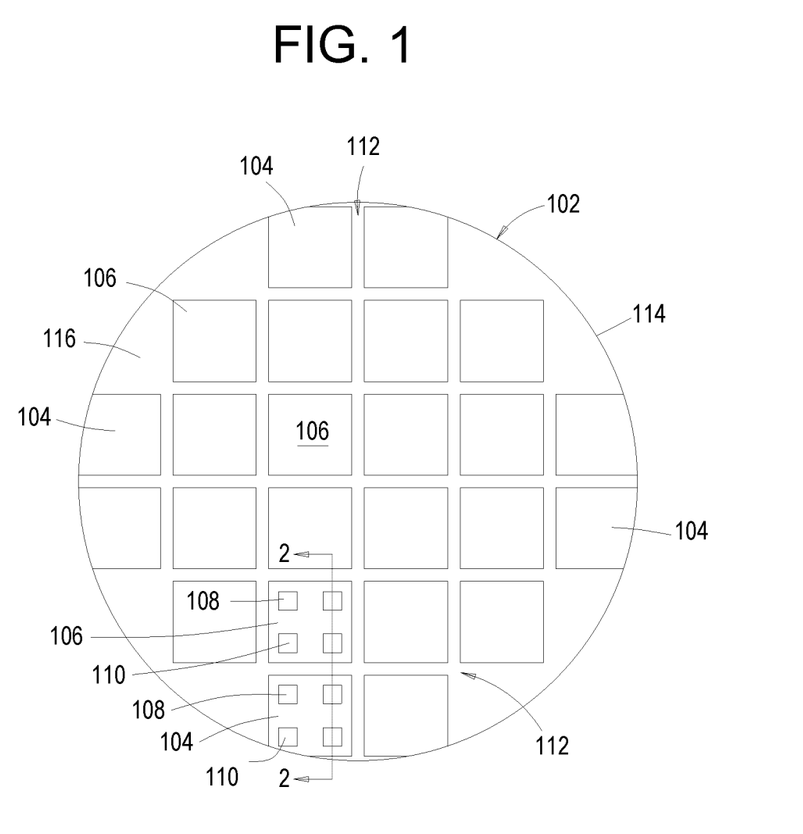
FIG. 1 is a schematic plan view of an exemplary wafer prior to bonding with a second wafer, according to an embodiment.

FIG. 1 is a plan view of a first wafer 102 prior to being stacked to form a wafer on wafer (WoW) package, later referred herein as a stacked wafer assembly. The first wafer 102 includes a die side (e.g., top surface 116) and an edge 114. The first wafer 102 includes a plurality of partial dies 104 and a plurality of fully complete integrated circuit (IC) (e.g., full) dies 106 formed on the top surface 116 of the first wafer 102. Scribe line areas 112 are defined between the partial and full dies 104, 106 to allow the partial and full dies 104, 106 to be separated during partitioning (i.e., dicing) of the first wafer 102 without damaging the structure and circuitry of the full dies 106.

The partial dies 104 not completely formed as a portion of the top surface 116 needed to fully form a functioning die is cut off by the edge 114 of the first wafer 102. Thus, the partial dies 104 are not functional dies and are generally discarded after dicing the first wafer 102. The partial dies 104 include conductive bond pads 108, 110 exposed on the top surface 116 of the first wafer 102 through a dielectric layer. The conductive bond pads 108 represent active bond pads while the conductive bond pads 110 represent dummy bond pads as further described below.

The full dies 106 are completely formed within the area defined within by the edge 114 of the first wafer 102 and are fully functioning dies. The full dies 106 thus reside inward of the partial dies 104. The full dies 106 also include conductive bond pads 108, 110 exposed on the top surface 116 of the first wafer 102 through the dielectric layer. Although eight (8) partial dies 104 and sixteen (16) full dies 106 are shown disposed on the first wafer 102 in the example illustrated in FIG. 1, the number of partial dies 104 and full dies 106 formed on the first wafer 102 may vary commensurate with the die size, wafer diameter and other design considerations.

One or more of the conductive bond pads exposed on the top surface 116 of the partial dies 104 and full dies 106 may be dummy conductive bond pads 110. The dummy bond pads 110 (also referred to as dummy pads 110) are not coupled to the underlying circuitry of the dies 104, 106. Although each die 104, 106 is illustrated in FIG. 1 as having 4 exemplary conductive bond pads of which one is labeled as pad 108 and one is labeled as pad 110, the number of conductive bond pads 108, 110 shown in FIG. 1 is simply representative of a plurality of conductive bond pads to avoid cluttering FIG. 1. The dies 104, 106 illustrated in other Figures may be shown having a different number of conductive bond pads 108, 110 for convenience of discussing that Figure. The actual number of conductive bond pads 108, 110 may vary to suit design constraints of the particular package being fabricated.

Figure 2:
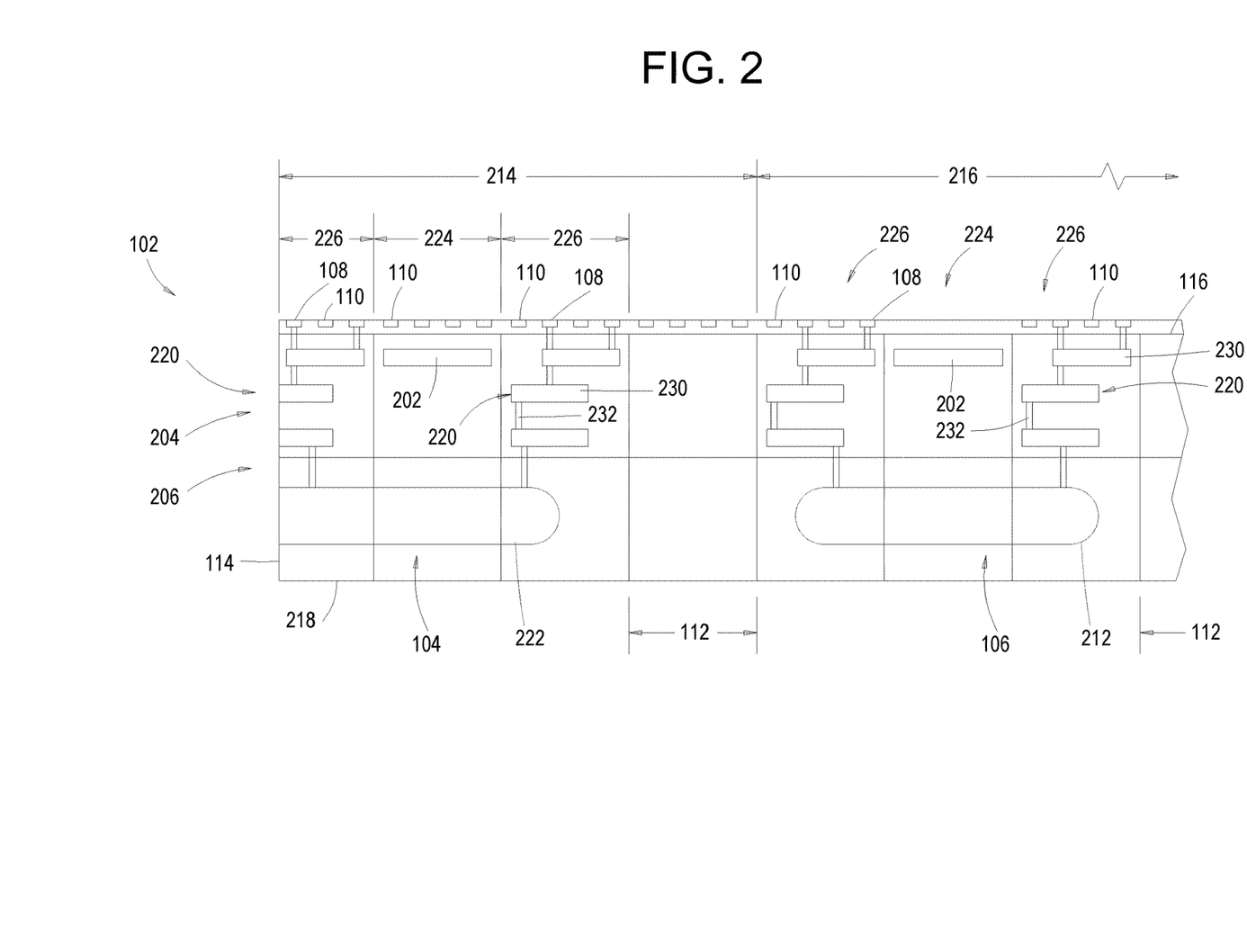
FIG. 2 is a partial sectional view of the wafer taken along section line 2-2 through a partial die and a fully functional die.

FIG. 2 is a partial sectional view of the first wafer 102 taken along section line 2-2 of FIG. 1 through one of the partial dies 104 and one of the full dies 106. As illustrated in FIG. 2, the partial dies 104 reside in an exclusion zone defined at the edge 114 of the first wafer 102. The exclusion zone 214 is generally ring-shaped and surrounds an active zone 216 of the first wafer 102 in which the full dies 106 are formed. Since FIG. 2 is a partial sectional view of the left side of the first wafer 102, it can be appreciated that the active zone 216 extends to the right beyond the center of the first wafer 102 to the portion of the ring-shaped exclusion zone 214 located to the right of what is illustrated in FIG. 2.

Currently, the industry standard for the width from the edge 114 for the exclusion zone 214 is about 3 mm, although the width of the exclusion zone 214 can be varied as desired. Although the exclusion zone 214 is illustrated beginning at the full die side of the scribe line area 112 defined between the partial die 104 and full die 106, the exclusion zone 214 can begin anywhere outward of the outermost full die 106, and optionally without any particularly defined relationship to the scribe line area 112.

As seen in the partial sectional view of FIG. 2, the first wafer 102 includes an interconnect region 204 formed on a substrate 206. Portions of the substrate 206 comprising part of the full dies 106 include solid state circuitry 212. The solid state circuitry 212 is formed by suitable semiconductor fabrication techniques. The circuitry 212 may be configured to perform memory or logic functions. For example, the circuitry 212 may be configured as a programmable logic device, such as field programmable gate array (FPGA), a memory device, a MEMS device, an optical device, a processor or other IC logic, memory, or solid state circuit structure. Optical devices include photo-detectors, lasers, optical sources, and the like.

Portions of the substrate 206 comprising part of the partial dies 104 include inoperable solid state circuitry 222. The inoperable circuitry 222 is formed by suitable semiconductor fabrication techniques in the exclusion zone 214 to balance the amount of metal within each layer across the first wafer 102 to improve flatness, and ultimately, provide dimensional stability to the features formed in the first wafer 102. The circuit devices comprising the inoperable circuitry 222 are incomplete due to the lack of sufficient area for complete circuit formation within the exclusion zone 214.

The bottom surface of the substrate 206 forms a backside 218 of the first wafer 102. The interconnect region 204 is formed on the top surface of the substrate 206.

The interconnect region 204 includes an exposed side that forms the top surface 116 of the first wafer 102. Thus, the exposed side (e.g., the top surface 116) of the interconnect region 204 is comprised of the conductive bond pads 108, 110 and portions of the dielectric layer separating the conductive bond pads 108, 110. The interconnect region 204 may include one or more conductive layers and one or more dielectric layers. The one or more conductive layers and the one or more dielectric layers within the interconnect region 204 are patterned to form conductive lines 230 and vias 232. The lines 230 and vias 232 are coupled to form interconnect wiring 220. The interconnect wiring 220 electrically couples the conductive bond pads 108 of the full dies 106 to the solid state circuitry 212 formed in the substrate 206. The bond pads 108 are conductive terminations of circuitry 212 with the full die 106 that provide one of ground, power or data communications. The conductive bond pads 108 may optionally include solder bumps (not shown) to facilitate ground, power and signal transmission with the die on the second wafer, as further discussed below.

Portions of the interconnect wiring 220 may alternatively be floating with the interconnect region 204. Some interconnect wiring 220 may be connected to dummy bond pads 110, but not to other circuitry. The interconnect wiring 220 may or may not be connected to other metal structures disposed within the interconnect region 204 or the substrate 206, including active and passive circuit elements. In other examples, the dummy bond pads 110 are electrically floating and not coupled to other circuits or devices.

The dies 104, 106 include one or more inductors 202. Although only one inductor 202 is shown residing in each die 104, 106 depicted in FIG. 2, any one or more of the partial die 104 and/or full die 106 may include multiple inductors 202 formed in the interconnect region 204. The inductor 202 is generally formed by one or more loops of metal material disposed in the interconnect region 204. The inductors 202 formed in the full dies 106 do not have active bond pads 108 or dummy bond pads 110 formed on the top surface 106 in a region 224 of the die 106 above the inductor 202. It is believed that having no bond pads 108, 110 in the region 224 of the die 106 above the inductor 202, the bond pads 108, 110 will not shield or otherwise denigrate the performance of the inductor 202. The regions 226 have no underlying inductors, and thus the plurality of bond pads 108, 110 are dispersed across the regions 226.

The region 226 that does not have an inductor 202 is defined outward of the region 224. In some instances, the region 226 may circumscribe the region 224. The region 226 generally has many of the conductive bond pads 108, 110 formed thereon. The conductive bond pads 108 electrically coupled by the interconnect wiring 220 to the solid state circuitry 212 formed in the substrate 206 generally reside in the region 226 laterally outward of the inductor 202.

Figure 5:
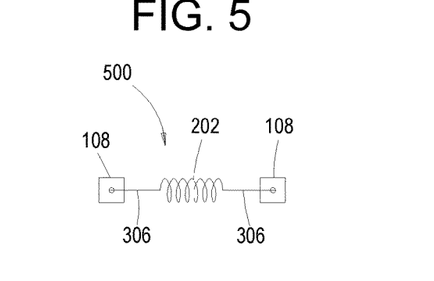
FIG. 5 is an electrical schematic of a circuit formed between bond pads of the partial die illustrated in FIG. 3, according to an embodiment.

The partial dies 104 are fabricated similarly to the full dies 106 with a couple of exceptions. First as noted above, the partial dies 104 have inoperable solid state circuitry 222. Secondly, the region 224 of the partial die 104 that includes one or more inductors 202 has a plurality of active bond pads 108 and/or dummy bond pads 110 formed on the top surface 106 above the inductor 202. The bond pads 108, 110 formed in the region 224 may optionally be fabricated utilizing a different mask set than used to fabricate the interconnect wiring 220 to improve flatness in the exclusion zone 214, which advantageously enhances the wafer stacking process. Using a different mask set to form the interconnect wiring 220 permits the structure of the bond pads 108, 110 present in the region 224 over the inductor 202 to be fabricated in a manner that results in a very flat topography of the region of the top surface 116 in the exclusion zone 214 which contributes to improved bonding and less bubble formation. The bond pads 108, 110 formed in the region 224 above the inductor 202 additionally contribute to substantially reduce bubble formation when the first wafer 102 is bonded to a second wafer as further described below. In one example, all of the bond pads 110 present in the region 224 of the partial die are dummy bond pads 110 (i.e., the region 224 does not have any active bond pads 108). In another example, at least one or more of the bond pads present in the region 224 of the partial die 104 are dummy bond pads 110 and at least one or more of the bond pads present in the region 224 of the partial die 104 are active bond pads 108. In yet another example, two of the bond pads 108 present in the region 224 are coupled by interconnect wiring 220 to the inductor 202 residing in the region 224, such as illustrated in the circuit schematic 500 illustrated in FIG. 5.

Continuing to refer to FIG. 2, the partial dies 104, like the full dies 106, includes a region 226 that does not have an inductor 202 which is defined outward of the region 224. In some instances, the region 226 may circumscribe the region 224. The region 226 generally has many conductive bond pads 108, 110 formed thereon. At least one or more of the conductive bond pads 108 electrically coupled by interconnect wiring 220 to the partial solid state circuitry 222 formed in the substrate 206 generally reside in the region 226 laterally outward of the inductor 202. In one example, at least one or more of the bond pads present in the region 226 of the partial die are dummy bond pads 110.

Figure 3:
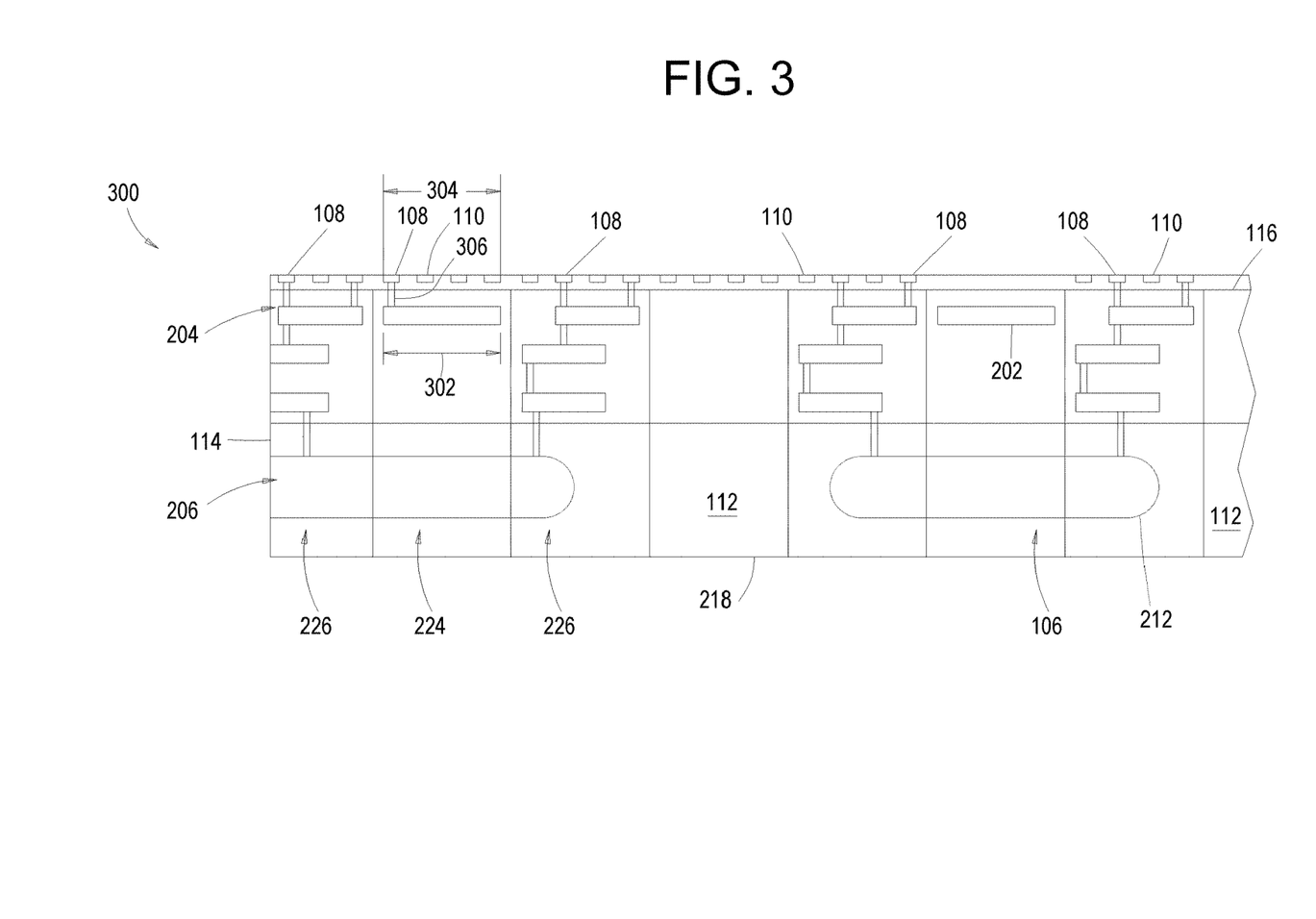
FIG. 3 is another partial sectional view of a wafer prior to bonding with a second wafer illustrating a partial die and a fully functional die in cross section, according to an embodiment.

FIG. 3 is partial sectional view of a first wafer 300 prior to bonding with a second wafer. The first wafer 300 may be utilized in place of the first wafer 102 described above when fabricating the stacked wafer assembly, as further described below. The first wafer 300 is generally fabricated the same as the first wafer 102 except wherein the partial die 104 includes at least two bond pads 108 formed in the region 224 of the first wafer 300 above the inductor 202 that are coupled to the inductor 202.

The inductor 202 is coupled at one end to one bond pad 108 and at an opposite end to another one of the bond pads 108 of the partial die 104 by the interconnect wiring 306. Although only one inductor 202 is shown in FIG. 3, a single partial die 104 may include multiple inductors 202 formed in the interconnect region 204. Generally, the bond pads 108 formed in the region 224 of the first wafer 300 are vertically above the inductor 202.

Figure 4:
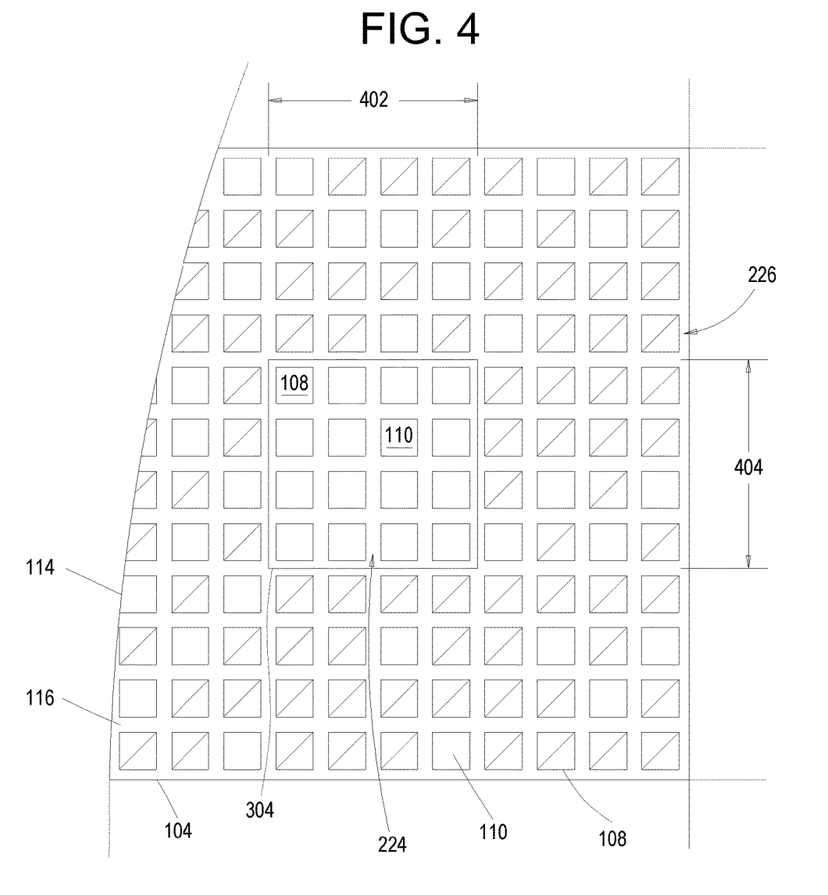
FIG. 4 is a plan view of the partial die illustrated in FIG. 3.

For example, at least a portion of the inductor 202 resides below the bond pads 108, 110 disposed in the region 224. For example, at least a portion of the inductor 202 is disposed at least partially within a boundary area 304 defined by an areal extent the bond pads 108, 110. Stated differently, at least a portion of the inductor 202 may be disposed outward of the boundary area 304 defined by the bond pads 108, 110. The areal extent the bond pads 108, 110 is generally defined by the outer boundary of all the bond pads 108, 110 located within the region 224. Better illustrated in FIG. 4, the boundary area 304 may be defined as the product of a width 402 and length 404 of the outer planar extents of the bond pads 108, 110 when the bond pads 108, 110 are in a grid arrangement. FIG. 4 additionally illustrates the distribution of the dummy pads 110 (shown by the open square pads) among the active bond pads 108 (shown by the square pads having a single diagonal stripe) that is coupled to circuitry 212, 222 within the dies 104, 106.

Returning to the example depicted in FIG. 3, the entire inductor 202 (illustrated by the indictor extents 302) is disposed within the boundary area 304 defined by the areal extent the bond pads 108, 110. The inductor 202 may be coupled between two bond pads 108 by interconnect wiring 306, such as illustrated in the circuit schematic 500 illustrated in FIG. 5.

Figure 6:
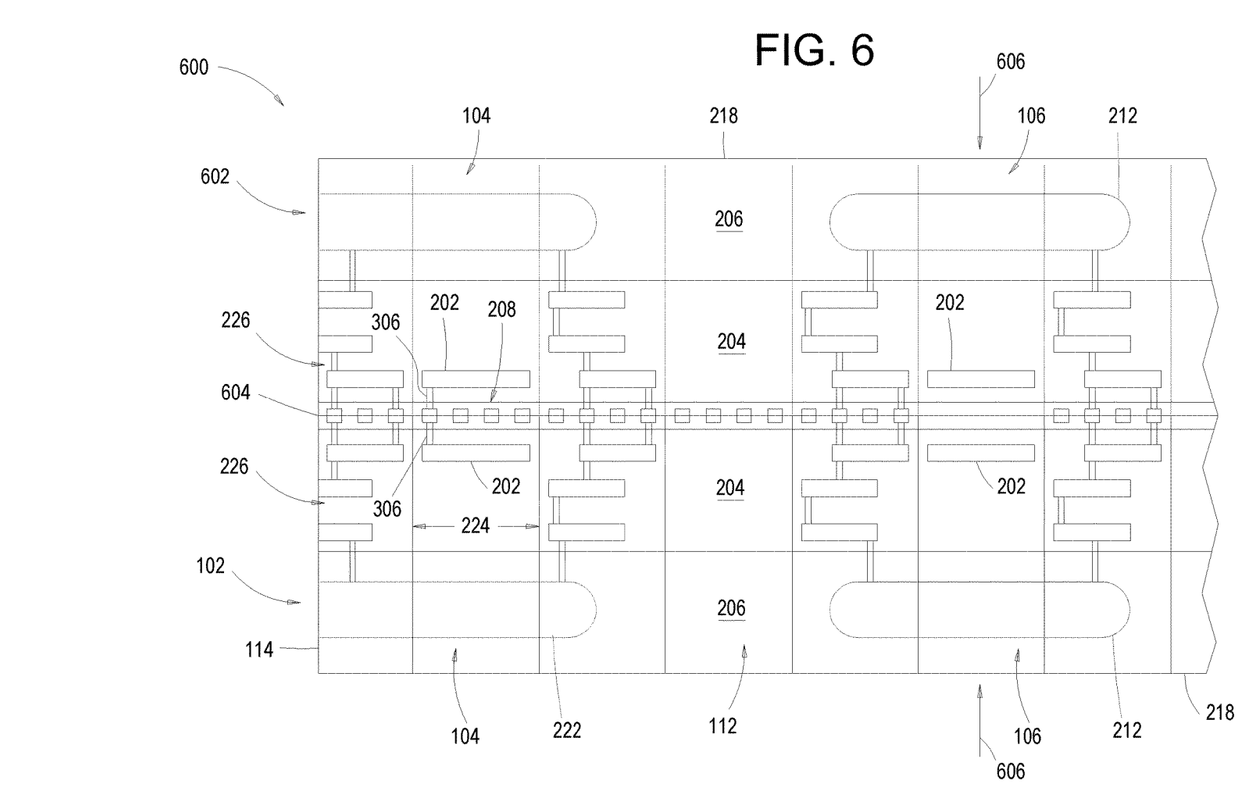
FIG. 6 is a partial sectional view of a stacked wafer assembly prior to dicing that includes a first wafer stacked on a second wafer illustrating bonds between bond pads of partial dies formed on facing surfaces of the wafers, according to an embodiment.

FIG. 6 is a partial sectional view of a stacked wafer assembly 600 prior to dicing that includes the first wafer 102 stacked on a second wafer 602. As mentioned above, the stacked wafer assembly 600 may be referred to as a wafer on wafer (WoW) package, and stacked full dies 106 separated therefrom, as stacked IC devices.

In the example depicted in FIG. 6, the second wafer 602 has a pattern of bond pads 108, 110 that matches the pattern of bond pads 108, 110 formed on the first wafer 102. In this manner, the bond pads 108, 110 of the facing wafers 102, 602 make electrical contact when the wafers 102, 602 are bonded together. The full dies 106 formed on each wafer 102, 602 may be all of the same type, some of the same types or different types. In one example, a full die 106 of the first wafer 102 configured to operate as a logic die may be stacked with a full die 106 of the second wafer 602 configured to operate as a logic die. In another example, a full die 106 of the first wafer 102 configured to operate as a logic die may be stacked with a full die 106 of the second wafer 602 configured to operate as a memory die. In yet another example, In another example, a full die 106 of the first wafer 102 configured to operate as a memory die may be stacked with a full die 106 of the second wafer 602 configured to operate as a memory die.

As discussed above, the first wafer 300 may be substituted for the first and/or second wafers 102, 602 in all of the examples provided herein. Furthermore, any of the wafers 102, 300, 602 may be a reconstituted wafer. A reconstituted wafer is a wafer made of previously separated dies that are rejoined to form the reconstituted wafer. The dies of the reconstituted wafer generally have been tested to remove underperforming dies such that the stacked package will more likely have a higher stacked IC device yield as opposed to utilized two non-reconstituted wafers.

The wafers 102, 602 are bonded together by applying a force, as shown by arrows 606. The wafers 102, 602 may also be heated while the force 606 is applied.

In the example depicted in FIG. 6, the dielectric layer (labeled as 604 in FIG. 6) is disposed between the wafers 102, 602. The dielectric layer 604 may include one or more layers. The one or more dielectric layers may be an oxide material or other suitable dielectric material suitable for bonding to a facing dielectric layer of the facing wafer. The force 606 utilized to press the wafers 102, 602 together contract the dielectric layers 604 and the bond pads 108, 110 of the facing wafers 102, 602, thus allowing electrical contact between pads 108 of the first wafer 102 to pads 108 of the second wafer 602, and between pads 110 of the first wafer 102 to pads 110 of the second wafer 102, while adhering to the exposed dielectric material layers 604 comprising the top surfaces 116 of the wafers 102, 602, thus securely bonding the wafers 102, 602 into the unitary stacked wafer assembly 600.

Thus, when the wafers 102, 602 are stacked and bonded using the dielectric layer 604, the circuitry 212 of the full dies 106 of the first wafer 102 are electrically connected to the circuitry 212 of the full dies 106 of the second wafer 102 through the bond pads 108, along with the dummy pads 110 of the full dies 106 of the first wafer 102 being electrically connected to the dummy pads 110 of the full dies 106 of the second wafer 102 when present. Similarly, the bond pads 108 of the partial dies 104 of the first wafer 102 are electrically connected to the bond pads 108 of the partial dies 104 of the second wafer 102, along with the dummy pads 110 of the partial dies 104 of the first wafer 102 being electrically connected to the dummy pads 110 of the partial dies 104 of the second wafer 102 when present.

It has been observed that the electrical connection between the bond pads 108 of the partial dies 104 formed on facing wafers 102, 602 significantly reduces, and in many cases eliminates, the incidence of bubble formation in the interface (i.e., in and along the dielectric layer 604) between the wafers 102, 602. It is believed that the presence of the pads 108 in the region 224 above the inductors 202 present in the partial dies 104 of the wafers 102, 602 provide a much flatter and robust adhesion surface, thereby substantially reducing the formation of bubbles which can lead to delamination of the stacked wafer assembly 600 and ultimately, scrapping of the stacked wafer assembly 600.

As mentioned above, the first wafer 300 may be utilized in place of either or both of the first and second wafers 102, 602 illustrated in FIG. 6. In one such example, the pads 108 (including dummy pads 110) present in the region 224 above the inductors 202 of each partial die 104 formed in the two wafers 300 comprising the stacked wafer assembly 600 are electrically coupled across the dielectric layer 604. In another such example, the inductors 202 of the partial dies 104 formed in the first wafer 300 comprising the stacked wafer assembly 600 are electrically coupled by the pads 108 present in the region 224 above the inductors 202 of each partial die 104 of the first wafer 300 across the dielectric layer 604 with the pads 108 present in the region 224 above the inductors 202 of the partial dies 104 of the second wafer 602. In FIG. 6, the interconnect wiring 306 coupling an inductor 202 disposed between the pads 108 is shown in phantom within one of the partial dies 104 to illustrate that the first wafer 102 may be configured as the first wafer 300. In another example, the second wafer 602 may include interconnect wiring 306 (also shown in phantom) coupled to an inductor 202 disposed between the pads 108 within one of the partial dies 104 to illustrate that the second wafer 602 may be configured as the wafer 300. In one embodiment, the pads 108 in the region 224 above inductors 202 disposed in partial dies 104 formed one of the facing wafers 102, 602 include at least one dummy pad 110. In another embodiment, the pads 108 in the region 224 above inductors 202 disposed in partial dies 104 formed one of the facing wafers 102, 602 may be all dummy pads 110. As noted above, it is believed that the pads 108 in the region 224 above inductors 202 disposed in partial dies 104 contribute substantially to maintain flatness with the exclusion are 214, thus substantially reducing the formation of bubbles which can lead to delamination of the stacked wafer assembly 600 and ultimately, scrapping of the stacked wafer assembly 600.

Figure 7:
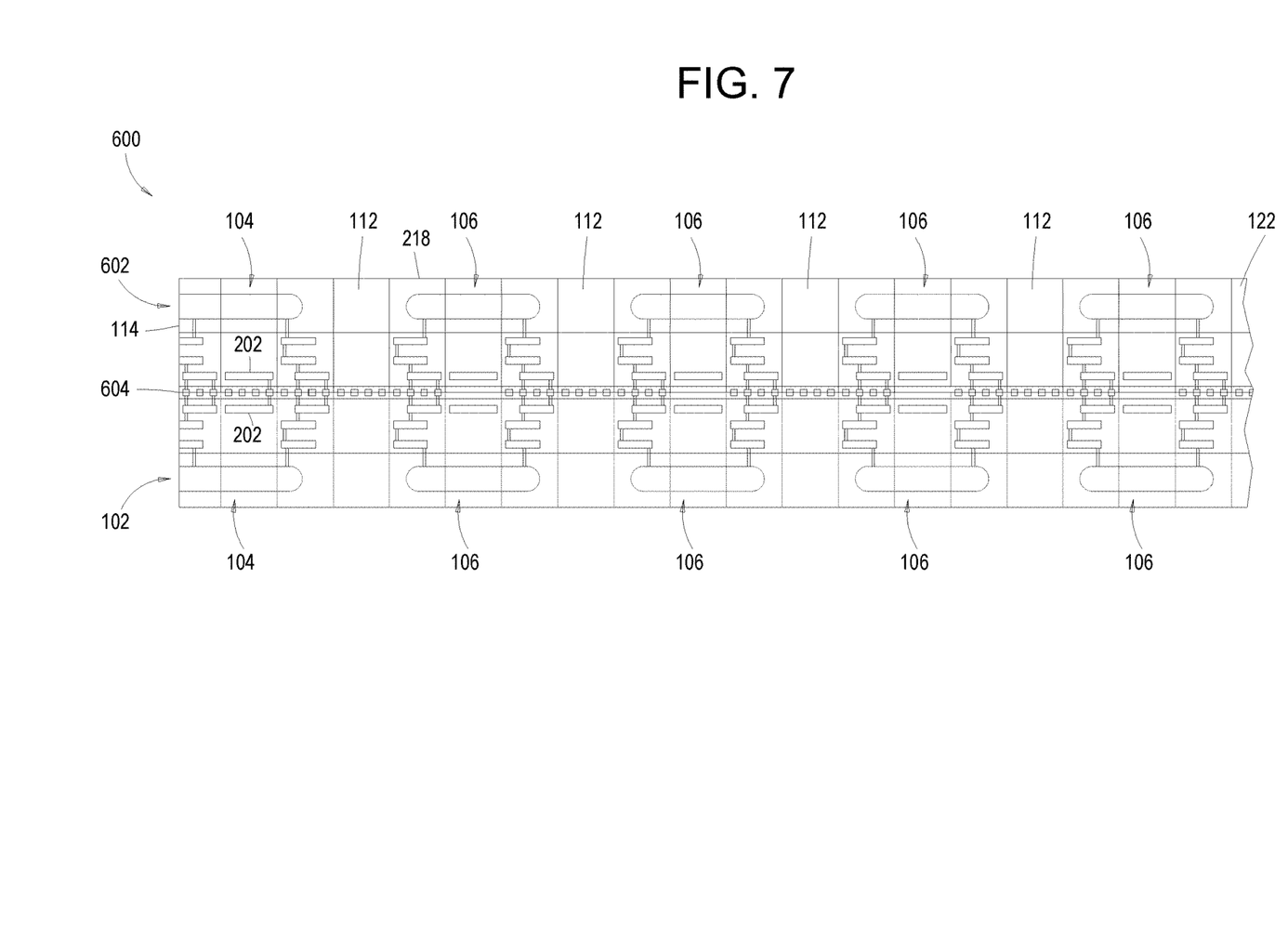
FIG. 7 is a partial sectional view of a stacked wafer assembly prior to dicing that includes a first wafer stacked on a second wafer illustrating bonds between bond pads of partial dies formed on facing surfaces of the wafers, according to another embodiment.

FIG. 7 is a partial sectional view of the stacked wafer assembly 600 prior to dicing that includes the first wafer 102 stacked on the second wafer 602. FIG. 7 is generally a larger illustration of the partial sectional view of FIG. 6 so that additional full dies 106 may be shown illustrating the electrical connection between bond pads 108 electrically coupling the full dies 106 located directly across the dielectric layer 604. Additionally, the bond pads 108 (including bond pads 110, when present) of partial dies 104 are also electrically connected across the dielectric layer 604. As a result of the electrical connection of the bond pads 108 present in region 224 of the partial dies 104 formed on the first wafer 102 with the bond pads 108 present in region 224 of the partial dies 104 formed on the second wafer 602, little to no bubble formation is realized during the bonding and fabrication of the stacked wafer assembly 600. At this stage, the full dies 106 of the stacked wafer assembly 600 are ready for separation from the other full dies 106 and the partial dies 104 by cutting the wafers 102, 602 in the scribe line area 112 provided between the dies 104, 106.

Figure 8:
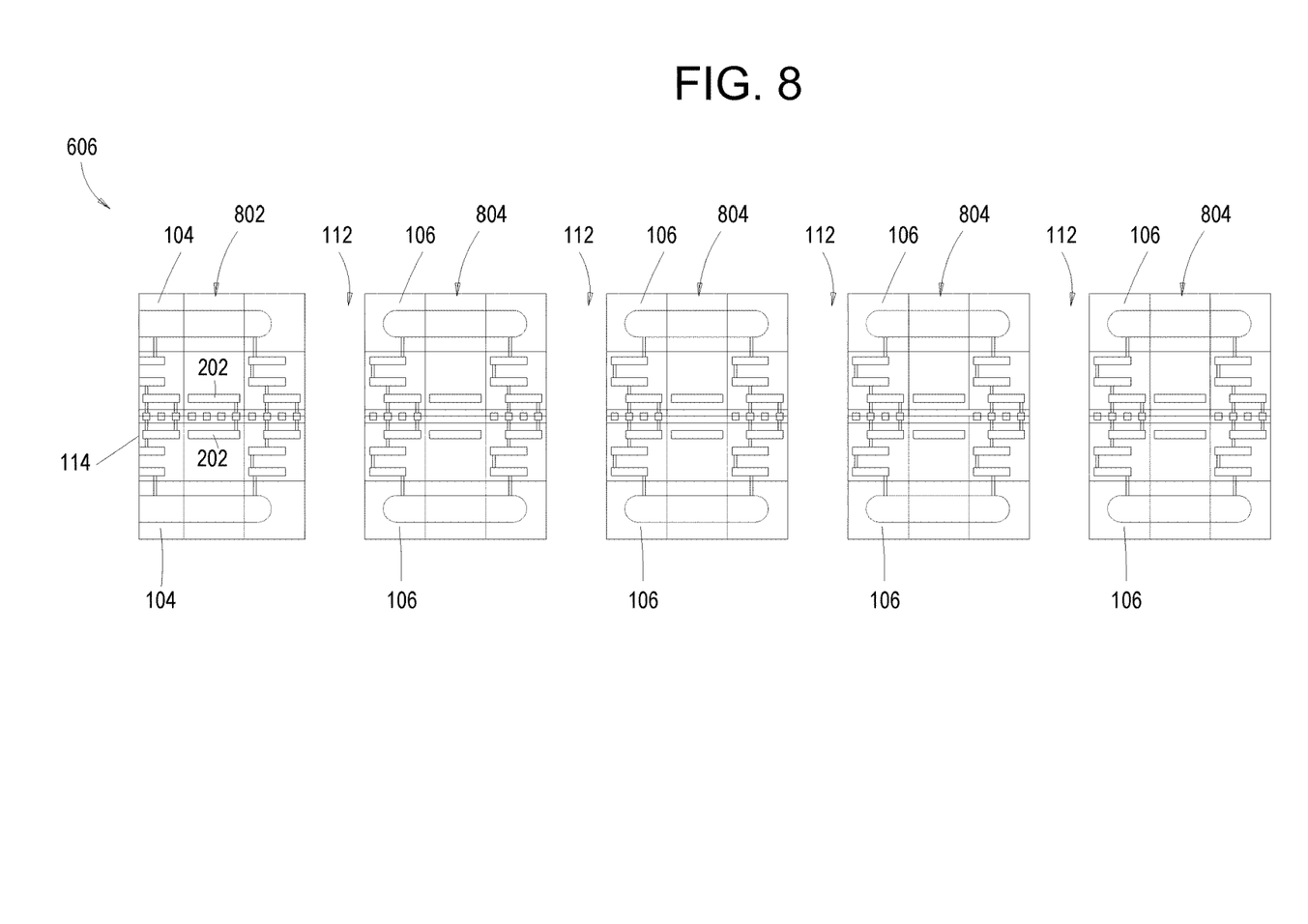
FIG. 8 is a partial sectional view of the stacked wafer assembly of FIG. 7 after dicing illustrating both stacked partial dies and stacked fully functional dies.
Figure 9:
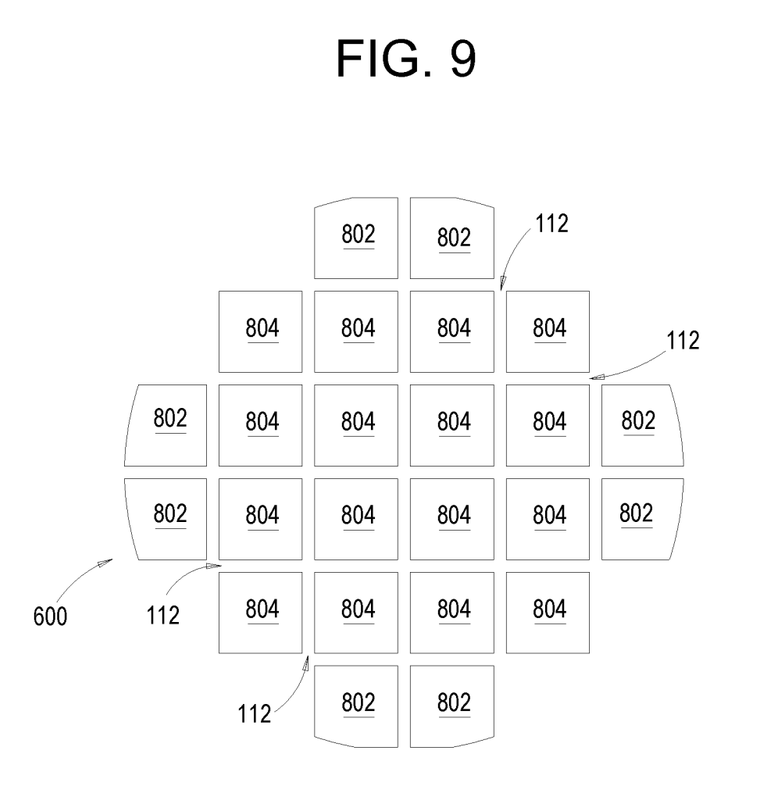
FIG. 9 is a plan view of the stacked wafer assembly of FIG. 7 after dicing.

FIG. 8 is a partial sectional view of the stacked wafer assembly 600 of FIG. 7 after dicing illustrating both stacked partial dies 802 and stacked fully functional dies 804. The stacked partial dies 802 includes at least two partial dies 104, while the stacked fully functional dies 804 includes at least two full dies 106. The stacked wafer assembly 600 is diced in the scribe line area 112 provided between the dies 104, 106. The separated stacked partial dies 802 and separated stacked fully functional dies 804 are also illustrated in the a plan view of FIG. 9 that shows the stacked wafer assembly 600 of FIG. 7 after dicing. Dicing may be performed using scribing and breaking, mechanical sawing, such as with a wire saw, laser cutting or other suitable technique. The stacked fully functional dies 804 each comprise two full dies 106 and are further processed into an integrated chip package for an electrical device. The stacked partial dies 802 are discarded or recycled.

Figure 10:
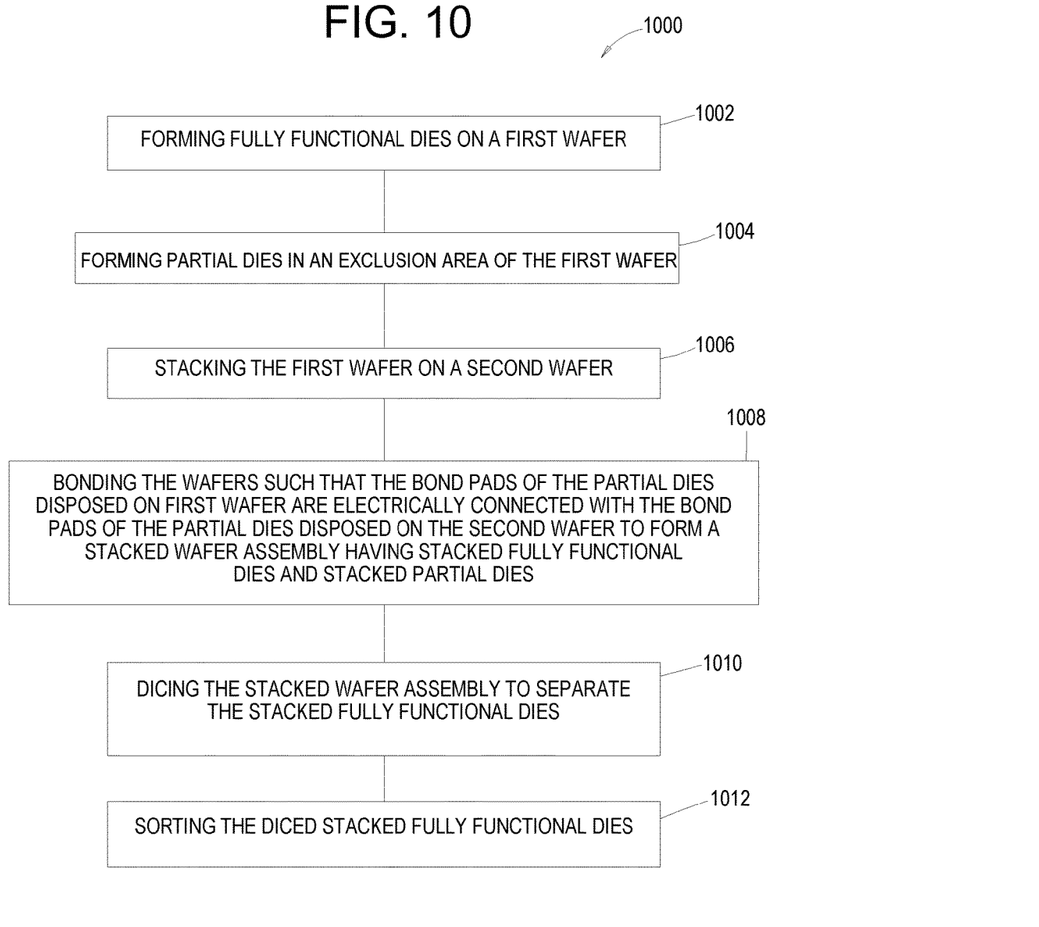
FIG. 10 is a flow diagram of a method for fabricating a stacked wafer assembly, according to an embodiment.

FIG. 10 is a flow diagram of a method 1000 for fabricating a stacked wafer assembly, such as the stacked wafer assembly 600, according to an embodiment. The method 1000 begins at operation 1002 by forming fully functional dies, such as the full dies 106, on a first wafer. Forming the fully functional dies generally includes a plurality of deposition, patterning and etch operations selected to generate circuitry, such as the circuitry 212, with a desired functionality, along with interconnect wiring 220 and bond pads 108. The patterning portion of operation 1002 is generally performed with a first mask set. The first mask set includes one or more lithography reticles that are utilized to transfer a pattern onto a photolithographic resist disposed on the wafer. The first mask set is configured not to form bond pads 108 over the inductors 202 in the regions 224 of the dies 106. The number of masks, along with the pattern of the masks, is selected to generate the circuitry 212, interconnect wiring 220 and bond pads 108 utilizing semiconductor solid state circuitry manufacturing techniques as known in the art, or as being continuously developed.

At operation 1004, partial dies, such as the partial dies 104 formed in the exclusion zone 214, are formed on the first wafer outward of the full dies 106. Forming the partial dies, as with forming the full dies, generally includes a plurality of deposition, patterning and etch operations selected to generate the metal and dielectric layers and structure, such as the non-functioning inoperable circuitry 222, the interconnect wiring 220 and bond pads 108 disposed over the inductors 202 present in the region 224. A portion of the patterning portion of operation 1004 may be performed with the first mask set. In one example, the formation of bond pads 108 disposed over the inductors 202 present in the region 224 is performed with one or more masks not present in the first mask set. Thus, the partial dies 104 are formed with a second mask set. The second mask set includes one or more lithography reticles that are utilized to transfer a pattern onto a photolithographic resist disposed on the wafer. The number of masks, along with the pattern of the masks, are selected to generate the desired structures, such as the inoperable circuitry 222, the interconnect wiring 220, bond pads 108, inductors 202, utilizing semiconductor solid state circuitry manufacturing techniques as known in the art, or as being continuously developed.

The use of a different set of masks to form the partial dies 104 relative to the set of masks utilized to form the full dies 106 allows more precise control and formation of the structures formed within the interconnect region of the partial dies 104, and particularly the formation of bond pads 108 disposed over the inductors 202 present in the region 224 which are not present in the full dies 106. This allows the topography of the top surface 116 of the wafer comprising the partial dies 104 to be much flatter than the surfaces of partial dies fabricated with the full dies utilizing a common mask set. The flat topography of the partial dies 104 contributes to successful stacking of the wafers with less defects and thus higher yields. Moreover, the flat topography of the partial dies 104 enhances good and robust electrical connection between the pads 110 on facing dies partial 104, thus significantly reducing the probability of bubble formation, and further contributing to robust bonding, high yields and superior performance of the stacked fully functional dies 804.

At operation 1006, the wafers 102, 602 are stacked with the top surface 116 of the first wafer 102 facing the top surface 116 of the second wafer 602. In this orientation, the bond pads 108 of the first wafer 102 are aligned with the bond pads 108 of the second wafer 602. Similarly, the bond pads 110 of the first wafer 102 are aligned with the bond pads 110 of the second wafer 602. During stacking of the wafers 102, 602, the dielectric layers 604 comprising the top surfaces 116 of the wafers 102, 602 contact each other.

At operation 1008, the wafers 102, 602 are bonded together. In one example, force 606 is applied to press the top surfaces 116 of the wafers 102, 602 together during the bonding operation. Heat may also be applied while the wafers 102, 602 are pressed together. After the bonding process is complete, the bond pads 108 of the first wafer 102 are electrically connected with the bond pads 108 of the second wafer 602, thus coupling the full dies 106 as stacked fully functional dies 804. Similarly, the bond pads 108 of the first wafer 102 are electrically connected with the bond pads 108 of the second wafer 602 including dummy pad 110 to dummy pad 110 connections, thus coupling the partial dies 104 as stacked partial dies 802. With the bond pads 108 of the partial dies 104 in the region 224 connected wafer to wafer, potential bubbling is substantially reduced thereby significantly increasing process yields.

At operation 1010, the stacked wafer assembly 600 is diced to separate the stacked fully functional dies 804. As discussed above, the stacked wafer assembly 600 is diced in the scribe line area 112 provided between the dies 104, 106. Dicing at operation 1010 may be performed by scribing and breaking, mechanical sawing, such as with a wire saw, laser cutting or other suitable technique.

At operation 1012, diced stacked dies 802, 804 are sorted. In one example, the stacked fully functional dies 804 are tested and sorted into bins of dies 84 having performance criteria falling within a predefined range. The stacked fully functional dies 804 are further processed into integrated chip packages for electrical devices. The stacked partial dies 802 separated from the stacked fully functional dies 804 are discarded or recycled.

Thus, the techniques and structures disclosed above significantly reduce bubble formation in stacked wafer assembly, which substantially reduces the probability of delamination and degradation of device performance, while advantageously increasing product yield. While the foregoing is directed to examples of the present disclosure, other and further examples may be devised without departing from the basic scope thereof, and the scope thereof is determined by the claims that follow.

What is claimed is:

1. A method for forming a stacked wafer assembly, the method comprising:
    contacting an exposed dielectric material layer of a first wafer to an exposed dielectric material layer of a second wafer;
    pressing the first wafer against the second wafer to cause the dielectric material layers to create a bond between the first wafer and the second wafer; and
    forming electrical connections between bond pads formed over a first inductor of a partial die residing on the first wafer and bond pads formed on a partial die residing on the second wafer; and
    forming electrical connections between bond pads of a full die residing on the first wafer and bond pads formed on a full die residing on the second wafer, wherein the full die and the partial die are structurally different.

2. The method of claim 1, wherein the bond pads formed on the partial die residing on the second wafer are disposed over a second inductor.

3. The method of claim 2 further comprising:
    electrically connecting the first inductor to the second inductor through at least one of the bond pads disposed on the partial dies.

4. The method of claim 2 further comprising:
    forming at least one bond pad on the full die residing on the first wafer utilizing a first mask set; and
    forming at least one bond pad on the partial die residing on the first wafer utilizing a second mask set.

5. The method of claim 4, wherein the first mask is configured not to form bond pads over an inductor.

6. The method of claim 4, wherein the second mask is configured to form bond pads over the first inductor.

7. The method of claim 4, wherein the first mask is configured not to form bond pads over an inductor and wherein the second mask is configured to form bond pads over the first inductor.

8. The method of claim 1 further comprising:
    forming an electrical connection between bond pads formed laterally offset from a second inductor of full dies residing on the first wafer and bond pads formed on full dies residing on the second wafer.

9. The method of claim 8, wherein no bond pads are formed over the second inductor.

10. The method of claim 8, wherein the bond pads formed over the first inductor are dummy pads.

11. The method of claim 1 further comprising:
    separating the partial dies from the full dies, wherein the partial dies have bond pad disposed over the first inductor and the full dies have no bond pads disposed over an inductor.

* * * * *